United States Patent
Dierichs (10) Patent No.: US 7,224,430 B2
(45) Date of Patent: May 29, 2007

(54) OPTICAL COMPONENT, OPTICAL SYSTEM INCLUDING SUCH AN OPTICAL COMPONENT, LITHOGRAPHIC APPARATUS, METHOD OF CORRECTING APODIZATION IN AN OPTICAL SYSTEM, DEVICE MANUFACTURING METHOD, AND DEVICE MANUFACTURED THEREBY

(75) Inventor: Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 121 days.

(21) Appl. No.: 10/976,158

(22) Filed: Oct. 29, 2004

(65) Prior Publication Data

US 2006/0091324 A1 May 4, 2006

(51) Int. Cl.
*G03F 7/20* (2006.01)
(52) U.S. Cl. .............................. 355/53; 355/43; 355/30; 438/795
(58) Field of Classification Search ............. 250/492.2; 355/53, 54, 30, 41, 43; 438/795, 530
See application file for complete search history.

(56) References Cited

U.S. PATENT DOCUMENTS 5,757,017 A * 5/1998 Braat ...................... 250/492.2

* cited by examiner

*Primary Examiner*—Kiet T. Nguyen
(74) *Attorney, Agent, or Firm*—Pillsbury Winthrop Shaw Pittman LLP (57) ABSTRACT

A method of correcting apodization in an optical system includes determining effects of apodization on an intensity distribution of a beam of radiation in a predetermined plane of the optical system; determining a more desirable intensity distribution of the beam of radiation in the predetermined plane such that apodization is corrected for; and absorbing portions of the beam of radiation in the predetermined plane as a function of location such that downstream from the predetermined plane the beam of radiation shows the more desirable intensity distribution. An optical component includes one or more absorbing layers designed to perform the absorption as a function of the location. The optical component may located in the pupil plane of the optical system.

18 Claims, 4 Drawing Sheets

OPTICAL COMPONENT, OPTICAL SYSTEM INCLUDING SUCH AN OPTICAL COMPONENT, LITHOGRAPHIC APPARATUS, METHOD OF CORRECTING APODIZATION IN AN OPTICAL SYSTEM, DEVICE MANUFACTURING METHOD, AND DEVICE MANUFACTURED THEREBY

BACKGROUND OF THE INVENTION

1. Field of the Invention

The present invention relates to an optical component, an optical system including such an optical component, a lithographic apparatus, a method of correcting apodization in an optical system, a device manufacturing method, and a device manufactured thereby.

2. Description of the Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

During its propagation through an optical system of a lithographic apparatus a beam of radiation is subject to changes in its phase and/or its intensity. These changes are caused, for example, by the medium through which the beam propagates and by the interaction with optical components with which the beam interacts in the optical system. Changes in phase of the beam are referred to as aberrations and changes in intensity of the beam in the pupil are referred to as apodizations. Apodization is the non-uniformity of the pupil irradiance. In a lithographic apparatus, it is important to have a beam of radiation that is highly uniform in intensity. Aberration and apodization should be as small as possible. Presently, aberrations can be corrected. U.S. Pat. No. 5,757,017, for example, discloses a lithographic system which includes several optical components. These optical components may be provided with a correction layer for compensating aberrations, i.e. for compensating undesired changes in phase, but doe not address apodization errors in a reflective lithographic system in any meaningful way.

SUMMARY OF THE INVENTION

It is an aspect of the present invention to solve problems related to apodization errors.

According to one embodiment of the present invention, an optical system includes an optical component for correcting apodization in the optical system, the optical component being configured to receive a beam of radiation with an upstream intensity distribution that is upstream from the optical component, which upstream intensity distribution deviates from a more desirable intensity distribution due to the apodization, the optical component including a layer configured to absorb portions of the beam of radiation as a function of location such that downstream from the pupil plane the beam of radiation has the more desirable intensity distribution.

In a further embodiment, an optical component for an optical system for correcting apodization in the optical system is configured to receive a beam of radiation with an upstream intensity distribution that is upstream from the optical component, which upstream intensity distribution deviates from a more desirable intensity distribution due to the apodization, the optical component including a layer configured to absorb portions of the beam of radiation as a function of location such that downstream from the pupil plane the beam of radiation has the more desirable intensity distribution.

In another embodiment, a lithographic apparatus includes an illumination system configured to condition a beam of radiation; a support configured to support a patterning device, the patterning device configured to impart the beam of radiation with a pattern in its cross-section; a substrate table configured to hold a substrate; and a projection system configured to project the patterned beam of radiation onto a target portion of the substrate and including an optical component as described above.

In a still further embodiment, a method of correcting apodization in an optical system, includes determining effects of apodization on an intensity distribution of a beam of radiation in a predetermined plane of the optical system; determining a more desirable intensity distribution of the beam of radiation in the predetermined plane; absorbing portions of the beam of radiation in the predetermined plane as a function of location such that downstream from the predetermined plane the beam of radiation has the more desirable intensity distribution.

In yet another embodiment, a device manufacturing method includes providing a beam of radiation; imparting the beam of radiation with a pattern in its cross section; projecting the beam of radiation after it has been patterned onto a target portion of a substrate; determining an intensity distribution of the beam of radiation in a predetermined plane of the optical system; determining a more desirable intensity distribution of the beam of radiation in the predetermined plane; and absorbing portions of the beam of radiation in the predetermined plane as a function of location such that downstream from the predetermined plane the beam of radiation has the more desirable intensity distribution.

BRIEF DESCRIPTION OF THE DRAWINGS

Embodiments of the present invention will be described, by way of example only, with reference to the accompanying schematic drawings in which corresponding reference symbols indicate corresponding parts, and in which:

FIG. 3 is a detailed view of a mirror in the pupil plane in the arrangement of FIG. 2a;

DETAILED DESCRIPTION

Figure 1:
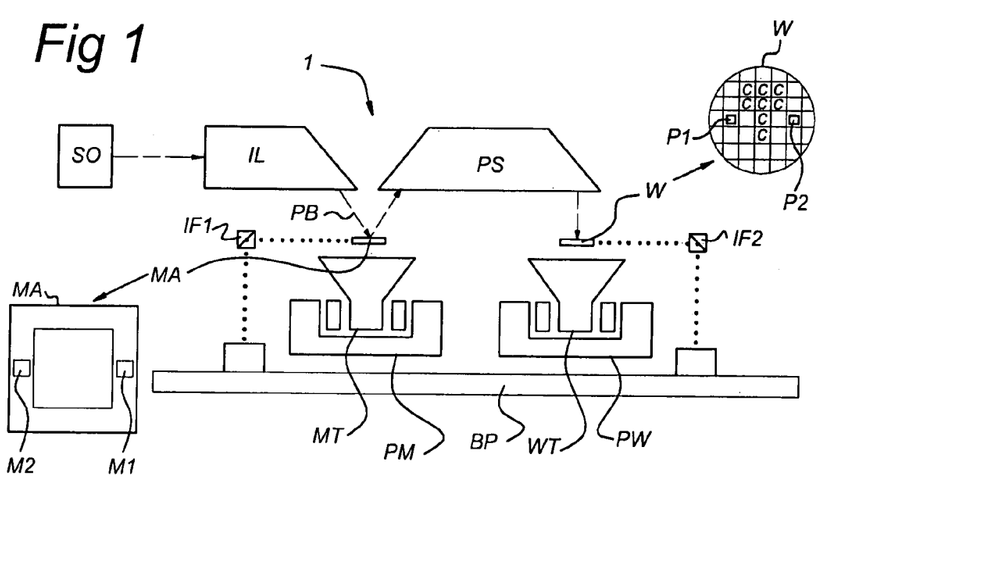
FIG. 1 depicts a lithographic apparatus according to an embodiment of the present invention.

FIG. 1 schematically depicts a lithographic apparatus 1 according to an embodiment of the invention. The apparatus 1 includes a base plate BP. An illumination system (illuminator) IL is configured to condition a radiation beam PB (e.g. UV radiation or EUV radiation). A support (e.g. a mask table) MT is configured to support a patterning device (e.g. a mask) MA and is connected to a first positioning device PM configured to accurately position the patterning device in accordance with certain parameters. A substrate table (e.g. a wafer table) WT is configured to hold a substrate (e.g. a resist-coated wafer) W and is connected to a second positioning device PW configured to accurately position the substrate in accordance with certain parameters. A projection system (e.g. a refractive projection lens system) PS is configured to project a pattern imparted to the radiation beam PB by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The support MT supports, e.g. bears the weight of, the patterning device. It holds the patterning device in a manner that depends on the orientation of the patterning device, the design of the lithographic apparatus, and other conditions, such as for example whether or not the patterning device is held in a vacuum environment. The support may use mechanical, vacuum, electrostatic or other clamping techniques to hold the patterning device. The support may be a frame or a table, for example, which may be fixed or movable as required. The support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located, for example, between the projection system and the substrate during exposure.

Referring to FIG. 1, the illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjusting device AD to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam to have a desired uniformity and intensity distribution in its cross-section.

The radiation beam PB is incident on the patterning device (e.g., mask MA), which is held on the support (e.g., mask table MT), and is patterned by the patterning device. Having traversed the mask MA, the radiation beam PB passes through the projection system PS, which focuses the beam onto a target portion C of the substrate W. With the aid of the second positioning device PW and a position sensor IF2 (e.g. an interferometric device, linear encoder or capacitive sensor), the substrate table WT can be moved accurately, e.g. so as to position different target portions C in the path of the radiation beam B. Similarly, the first positioning device PM and another position sensor IF1 (e.g. an interferometric device, linear encoder or capacitive sensor) can be used to accurately position the mask MA with respect to the path of the radiation beam PB, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT may be realized using a long-stroke module and a short-stroke module, which form part of the second positioning device PW. In the case of a stepper, as opposed to a scanner, the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions. These are known as scribe-lane alignment marks. Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
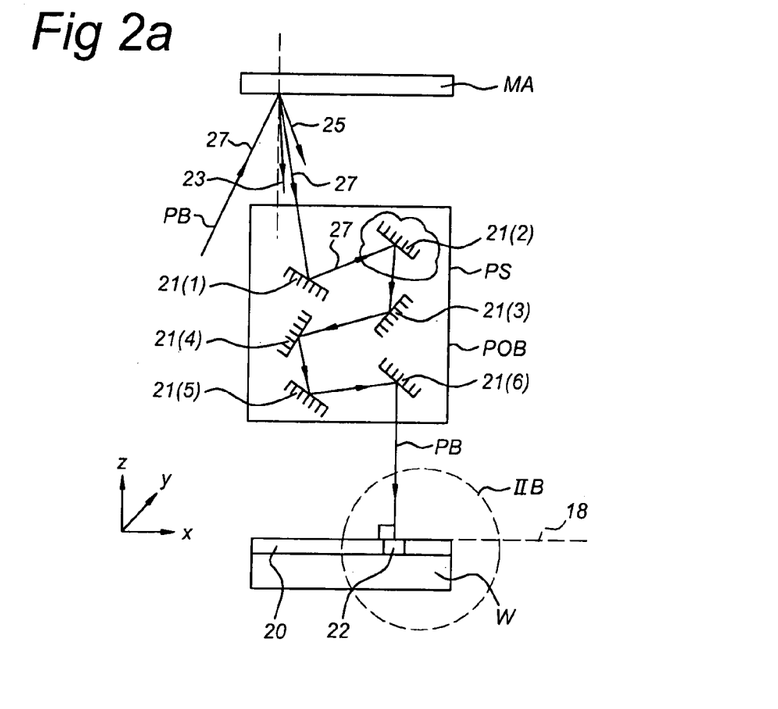
FIG. 2a is a detailed view of the projection system of the apparatus of FIG. 1.

FIG. 2a is a detailed view of the projection system PS in the apparatus of FIG. 1. The projection system PS includes a projection optics box POB. The projection optics box POB includes mirrors 21(i), i=1, 2, . . . I. Six mirrors are shown in FIG. 2a. Mirror 21(2) is referred to as "pupil mirror" indicating that this mirror 21(2) is located in a pupil plane of the projection system PS. Other designs may have a different number of mirrors. Moreover, the pupil mirror may be at a different position. Each angle between beam PB and mask MA corresponds to a position on the pupil mirror 21(2) and vice versa. The other mirrors are located at intermediate planes between field and pupil plane.

The substrate W is provided with a resist layer 20. In the resist layer 20, an exposed part 22 is indicated. The substrate W is located on a predetermined z-position which is indicated by reference numeral 18. This z-position is the wafer level 18.

The beam of radiation PB is reflected (for a reflective type lithographic apparatus) by the mask MA and enters the projection optics box POB. The beam of radiation PB is diffracted by the mask MA in several orders which are referred to as respective rays 23, 25 and 27 in FIG. 2a. In the projection optics box POB, the beam of radiation PB is reflected by the six mirrors 21(i). Finally, the beam of radiation PB exits the projection optics box POB and impinges on resist layer 20 on substrate W. The beam of radiation PB hits the resist layer 20 at the exposed part 22. It is desirable that the axis of symmetry of the beam of radiation PB hits the resist layer 20 substantially perpendicularly. The reason for this will become apparent from FIG. 2b. "Axis of symmetry" is here used to indicate a ray in which all the intensity (optical power) can be thought to be concentrated. In fact, the total intensity of the beam of radiation PB is determined by the number of diffraction orders that pass through the projection optics box POB. Throughout this text, it is assumed that the beam of radiation PB is uniform and completely illuminates the pupil mirror 21(2). In practice, when the lithographic apparatus is used for imaging, this may be different, as a customer may use his own specified illumination, for example annular illumination.

Figure 2B:
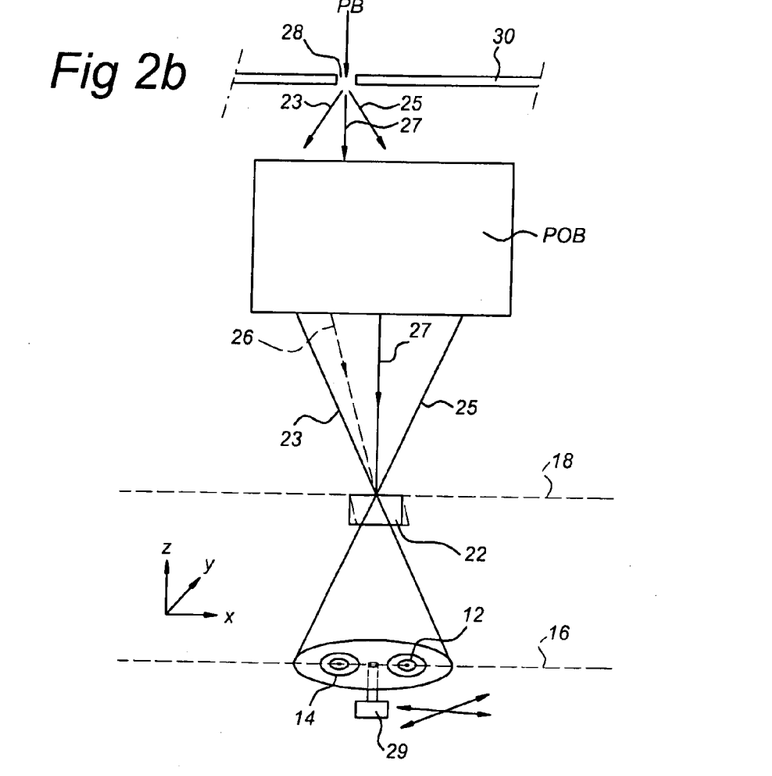
FIG. 2b is a schematic view of part IIB of FIG. 2a to explain effects of apodization.

FIG. 2b shows the projection system POB. Upstream from the projection system POB, on the level of the mask MA (which has now been removed) a plate 30 with a pinhole 28 is provided. The pinhole may have a diameter in the range of 50 µm to 200 µm. Moreover, a detector 29 to measure apodization is provided. In the setup of FIG. 2b, there is no substrate W present. The detector 29 is present somewhere downstream of the substrate level 18, i.e. out-of-focus such that it can measure the intensity of the beam of radiation PB as function of a location in the x-y plane. The z-level where detector 26 is located is referred to with reference numeral 16. The z-level 16 and the detector 29 are thus located in the "far field". The detector 29 is movable in the x-y plane and connected to a suitable processor (not shown) arranged to receive measurement signals and provide measurement data to a user. This is explained, for example, in U.S. Pat. No. 6,710,856.

A far field intensity pattern can now be measured in the following way. The beam of radiation PB is directed to the pinhole 28. Diffracted rays 23, 25, 27 are generated by the pinhole. These rays pass through the projection optics box POB and are focussed at wafer level 18. After passing the wafer level 18, they diverge again. If all the optics in the lithographic apparatus and in the projection optics box POB are perfect the rays 23, 25 will have an equal intensity and the beam of radiation PB as impinging on wafer level 18 will actually be perpendicular to the x-y plane. However, if the optics and the projection system POB are not perfect and introduce local intensity deviations the beam of radiation PB as impinging on wafer level 18 will effectively be tilted relative to the ideal perpendicular direction. This has been indicated with a dashed line 26 in FIG. 2b.

This can be measured by detector 29. Assuming the intensity as measured by the detector 29 in the x-y plane is lower at a certain location 14 in the far field and higher in a certain location 12, effectively this means that the axis of symmetry of the beam of radiation PB is shifted from line 27 to line 26 and will not be perpendicular relative to the wafer level 18.

As lithographic apparatus are used to project a plurality of structures exactly on top of each other, it will be apparent that a non-uniform beam of radiation PB poses a serious problem. If the exposure is not exactly in focus the tilted axis of symmetry will cause a pattern shift, also known as overlay error.

It should be appreciated that other techniques may be used to measure or calculate apodization for a projection system.

With the setup of FIG. 2b apodization can be measured for a beam that originates from the position of the pinhole 28. In a first embodiment, it is assumed that the apodization does not depend on the x and y position of this pinhole, i.e., the apodization is field independent.

The present invention is based on the insight that the intensity distribution as measured in the far field corresponds to a similar intensity distribution in the pupil plane of the projection optics box POB, and, thus, if one is able to correct the intensity profile at pupil plane level in the projection system the intensity distribution in the far field is also corrected and, consequently, the axis of symmetry of projection PB as impinging on wafer level 18 is also corrected.

Since the pupil mirror 21(2) is located in the pupil plane this mirror can be used to correct the intensity distribution. Before giving an example of how this can be done, however, a typical example of such a pupil mirror 21(2) is explained with reference to FIG. 3.

Figure 3:
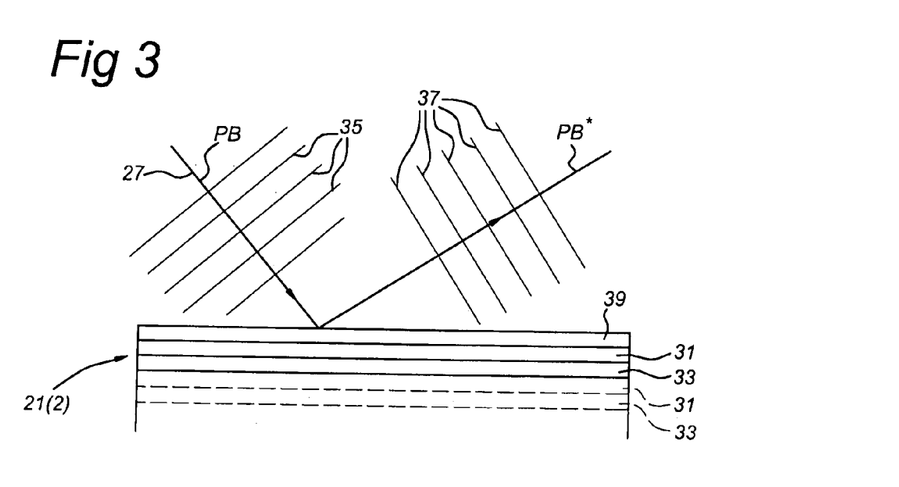

FIG. 3 is a more detailed view of the pupil mirror 21(2). FIG. 3 shows the beam of radiation PB and a reflected beam of radiation PB*. The beam of radiation PB is reflected by the multilayer on the mirror 21(2). The reflection of a single layer is minimal. For contamination and degradation minimisation, this may start for example with a thin reflective layer 39 of, for example, ruthenium (Ru) or palladium (Pa). The mirror 21(2) includes several other layers 31, 33 of different materials. For example, layer 31 may include silicon (Si) and layer 33 may include molybdenum (Mo). However, other materials may be used instead. The layers 31, 33 are deposited in sets. The first two sets 31, 33 are indicated in FIG. 3, one additional set is indicated in dashes. It is to be understood that the mirror 21(2) (as well as the other mirrors 21(i)) include many layer sets 31, 33. The sets may include more than 2 layers. Such multilayer mirrors are commonly used in EUV applications, and need no further explanation here. Cross-sectional planes through the incoming beam of radiation PB are referred to with reference numeral 35 and cross-sectional planes through the reflected beam of radiation PB* are referred to with reference numeral 37.

Figure 4:
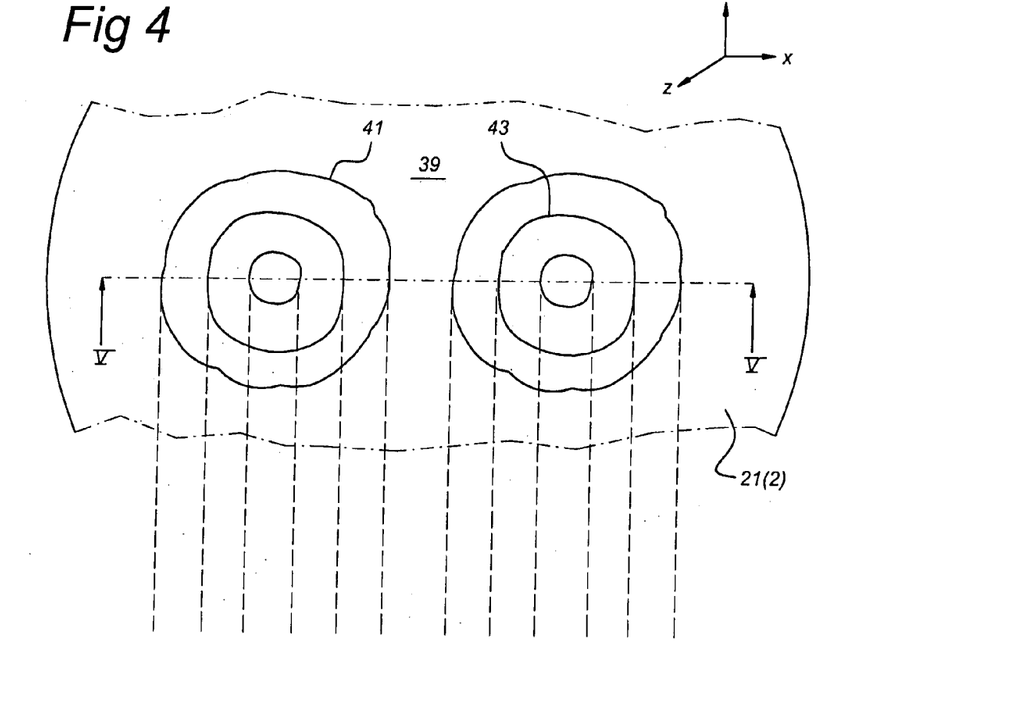
FIG. 4 is a top view of an intensity profile.

In FIG. 4, a cross-sectional view through an example of an intensity distribution of the beam of radiation PB at pupil plane level, i.e. at the level of pupil mirror 21(2), is shown. The example shown corresponds to the far field intensity distribution shown in FIG. 2b, so assumes a similar apodization of the system. Thus, FIG. 4 shows intensity contours 41, 43. At each intensity contour 41, 43 the intensity is constant. At intensity contour 43 the intensity is, e.g., stronger than at intensity contour 41.

In general, the intensity of the beam of radiation PB will vary along the pupil plane. Here, by intensity variation it is not meant the change in intensity caused by the pattern that is contained in the beam of radiation PB when it is reflected by mask MA, but the change in intensity in a surface perpendicular to a portion of the beam PB originating from one point at mask level that will be projected on a point at substrate level. As stated above, a similar variation in intensity will be present at the far field level 16. Although the intensity distribution of the beam of radiation PB at pupil plane level may be different from the intensity at the far field level 16, any change in the intensity distribution at the pupil plan level will be reflected by a corresponding change at the far field level 16.

Figure 5:
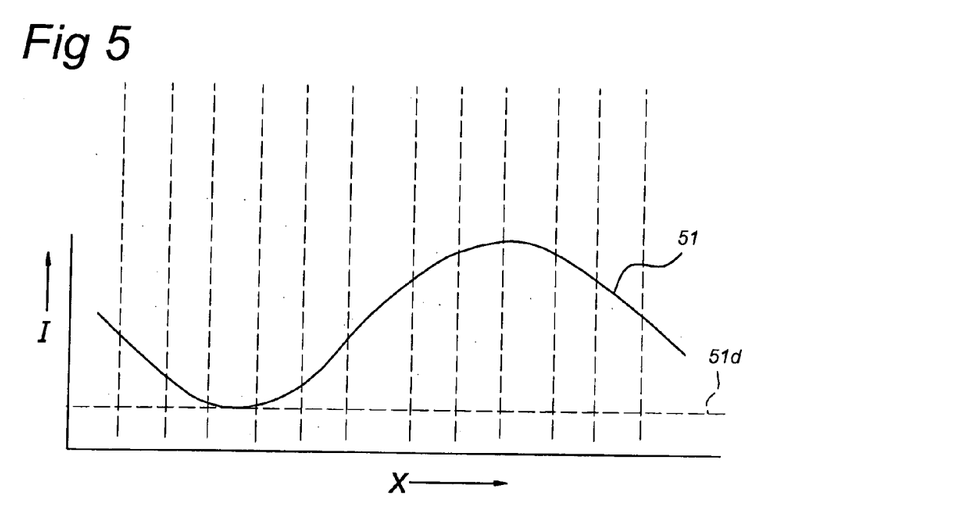
FIG. 5 is a sectional view showing a beam intensity versus location along line V—V in FIG. 4.

FIG. 5 is a side view of FIG. 4 along line V—V. The Figure shows an intensity 51 as a function of position in the pupil plane. This is also referred to as "intensity profile". Although the profile 51 is shown to be sinusoidal in shape, other differently shaped profiles are possible, for example parabolic. For lithographic purposes, it is desirable to have a beam of radiation that has a controlled intensity distribution, and typically a uniform intensity distribution is desired. Such a uniform intensity has been indicated in FIG. 5 as a function of position along the beam with a dashed line 51d. It is observed that for clarity reasons, line 51d is shown as a straight line. However, this assumes that the system has no apodization downstream from mirror 21(2) anymore. If the system has apodization downstream from the mirror 21(2) the desired intensity distribution at pupil plane level will not be a straight line. The actual curve of the desired intensity distribution 51d at pupil plane level can be calculated.

This invention presents a pupil mirror 21(2) that is designed to absorb portions of the beam of radiation PB as a function of position on the mirror surface such that the reflected beam of radiation PB* has a desired intensity distribution at the pupil plane level. Thus, a uniform transmission results for the angle distribution for each point at wafer level 18. By doing so, the axis of symmetry of the beam of radiation impinging on wafer level 18 is also corrected to be perpendicular. The correction profile for obtaining the uniform transmission for all angles at all points on wafer level 18 may be obtained by measuring the profile or by simulating the profile from the design data of both the mirrors and the coatings on the mirrors.

Figure 6A:
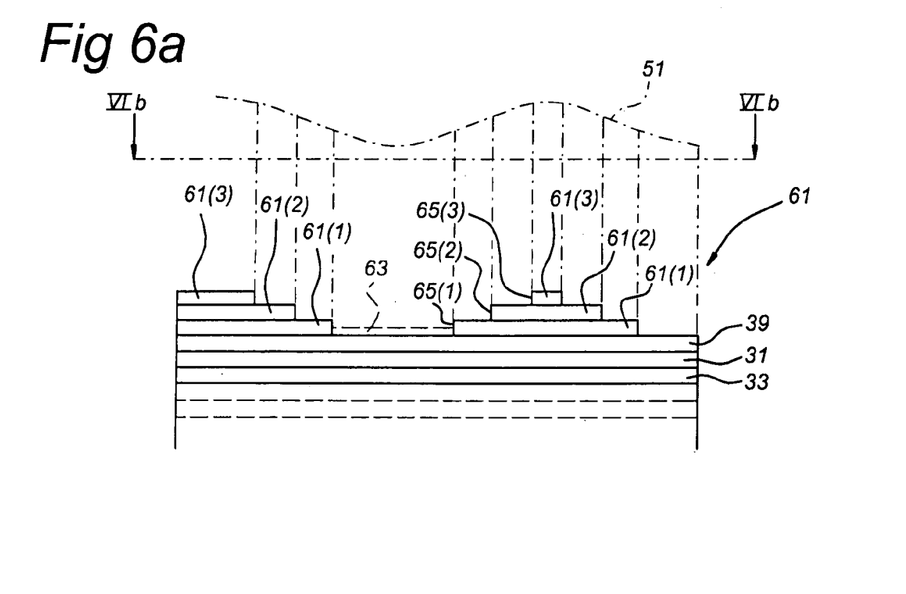
FIGS. 6a, 6b show an embodiment of the present invention.

FIG. 6a shows the mirror 21(2) from FIG. 3 with an additional layer 61 including one or more additional sub-layers 61(j), j=1, 2, . . . J and an optional additional layer 63 indicated by a dashed line. The sub-layers 61(j) are applied on the reflecting layer 39 in accordance with the intensity profile 51 shown in FIG. 5 (and schematically repeated in FIG. 6) and as measured by detector 29. The material of the sub-layers 61(j) is chosen such that it has negligible effect on the phase of the beam of radiation PB and only affects the intensity of the beam PB by local absorption. The material and thickness chosen for each additional sub-layer 61(j) depend on the wavelength of the beam of radiation PB and the amount of apodization. In one application, the wavelength is EUV, where $\lambda$=13.5 nm. Then, a suitable material for all additional layers 61(j) is silicon (Si) since for EUV of this wavelength the phase of beam of radiation PB is hardly affected. Yet, where the beam of radiation PB hits one or more sub-layers 61(j) it is absorbed by silicon. Instead of Si, Al can be used since also Al has a small deviation from 1 in the real part of the refractive index.

The additional sub-layers 61(j) form a step like structure. This may be implemented by providing each one them with a hole 65(1), 65(2) . . . 65(j) in them. A hole 65(j) in a layer 61(j) overlaps a hole 65(j−1) of a preceding layer 61(j−1).

Figure 6B:
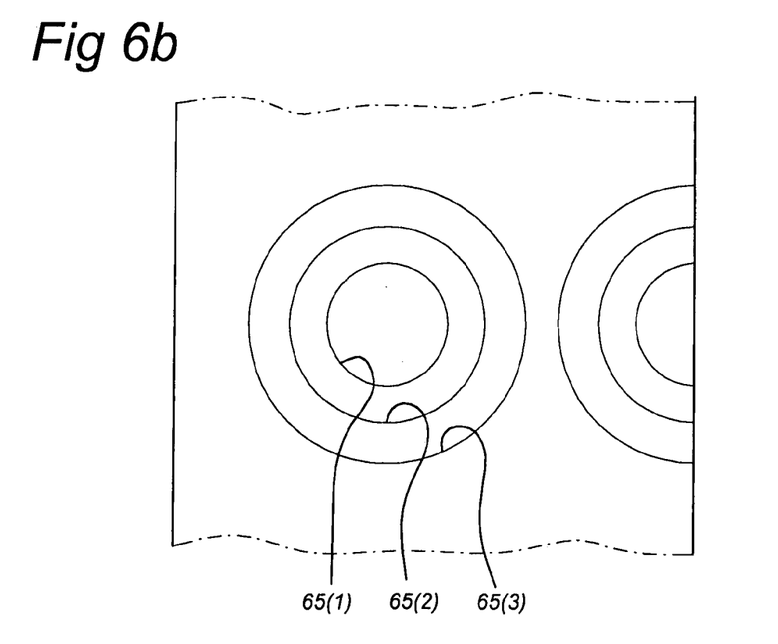

This is further illustrated by FIG. 6b which shows a top view of the structure shown in FIG. 6a. FIG. 6b shows the holes 65(j) as being circular, however, any other shape is possible, as required to provide the best possible correction for apodization effects.

The successive holes 65(j) are designed such that there is a combined hole 65(1) . . . 65(j) with a step like wall, the contour of which follows as good as possible the intensity profile 51, such that at locations where the intensity is high, the beam of radiation PB has to pass a relatively large number of additional sub-layers 61(j). Since each additional layer 61(j) absorbs a portion of the optical power of the beam of radiation PB, thus, the intensity distribution of the beam of radiation can be corrected tin the pupil plane. The number of additional sub-layers 61(j) and number of holes 65(j) are selected such that the reflected beam of radiation PB* shows substantially the desired intensity profile 51d at pupil plane level.

The preferable solution is that on the pupil mirror 21(2) a single material is used for absorption, for example Si or Al, since these materials have a small deviation from 1 in the real part of the refractive index, see below. Mo (molybdenum) can also be used. Mo has the advantage compared to Al that the absorption is less, but it introduces a larger phase difference. The main effect of the materials is absorption. To correct for an intensity variation, one can apply the layer in various deposition runs, with each run having a different area. If, for example, the intensity profile is sinusoidal, where a minimum intensity is alternated with a maximum, one can use a scheme as is shown in FIGS. 6a, 6b.

However, for a relatively thick total Si layer 61, for example having a total thickness of 100 nm, it is difficult to avoid that the sub-layers 61(j) will have an effect on the phase of the beam of radiation PB. In this case, it may be necessary to apply extra layer 63 on the reflecting surface 39 of a material that, contrary to the material of the layers 61(j), not only affects the intensity but also affects the phase of the beam of radiation PB. An example of the latter material is molybdenum (Mo). The effect on the intensity and the phase can be described by the complex index of refraction (n). In short, the complex index of refraction (n) may, in scalar form, be written as:

$$n = 1 - \delta + i\beta,$$

where $\delta$ relates to the real part of the complex atomic scattering factor and $\beta$ relates to the imaginary part of the complex atomic scattering factor. More information as well as a mathematical derivation of $\delta$ and $\beta$ in terms of the real and imaginary parts of the complex atomic scattering factor can for example be found in "Soft x-rays and extreme ultraviolet radiation"—David Attwood ISBN 0-521-65214-6. For layer 61, in order to have a relatively strong effect on the intensity of incident radiation, a material with a small $\delta$ and a large $\beta$, resulting in a large $\beta/\delta$ ratio, is preferred to be used. On the other hand, for layer 63 a material with a small $\beta$ and a large $\delta$, giving a small $\beta/\delta$ ratio, is preferred to be used in order to have a relatively pronounced effect on the phase of the incident radiation. In addition to molybdenum (Mo) as described above, also ruthenium (Ru), beryllium (Be) and/or rhodium (Rh) may be used. The layer 61 and the layer 63 may be covered with a protective coating, for example ruthenium (Ru) or palladium (Pa).

As stated previously, aberration correction and apodization correction are two different effects. Aberration effects can also be corrected for by applying a coating with a predetermined profile on the pupil mirror 21(2). It is possible to combine layer 61 and such a coating for both corrections. This simplifies the final coating on pupil mirror 21(2).

As indicated before, the present invention is not restricted to application on the pupil mirror 21(2) shown in the right hand top corner of the projection optics box POB in FIG. 2. Application of an additional layer on other mirrors 21(i), however, will not only affect pupil uniformity but also results in a field dependent effect on the beam of radiation PB. The additional layer on other mirrors 21(i) affects the intensity distribution of the beam of radiation PB depending on from which location at mask level a portion of the beam of radiation PB on a mirror 21(i) (i≠2) originates. Only in the pupil plane there is no dependency on the location at mask level from which the beam of radiation originates.

Also, the invention may be applied equally to transmissive optical components (lenses) as opposed to reflective optical components. In a system with lenses or in catadioptric systems, the invention may be implemented by the incorporation of a gradient filter in the pupil plane. The present invention is not limited to EUV systems in particular.

The sub-layers 61(j) as shown in FIGS. 6a, 6b may be arbitrary in shape. However, the sub-layers may be distributed one layer on top of the other that a step in thickness occurs when going from, for example, layer 61(j+1) to layer 61(j), or the other way round.

Sub-layers 61(j) including the following elements with the following values for $\beta$ and $\delta$ may be used. Silicon (Si) with $\beta=0.0007$ and $\delta=0.0018$ and aluminium (Al) with $\beta=0.0028$ and $\delta=0.0297$. Molybdenum (Mo) with $\beta=0.0789$ and $\delta=0.0064$ yielding a complex index of refraction with an imaginary part substantially larger than the real part may be used for layer 63. Below is some information about thicknesses of the layers 61(j). Absorption $I=I_0*\exp(-4*\pi*\beta*t/\lambda)$, with t=thickness, $\lambda$=wavelength, and $\beta$ see above. Relative phase shift $\Delta\phi=(2*\pi*\delta/\lambda)*t$ in which $\delta$ has the same meaning as above. As an example, 5% absorption results for Si in a thickness of 30.6 nm, for Mo this is 8.6 nm and for Al this is 1.9 nm. The corresponding phase shifts are $10^{-2}$, 0.32 and $-1.1*10^{-2}$ respectively. Thus, the desirable for relatively large uniformity corrections (>10%) is a Si/Al multilayer, which has substantially no phase effects but only absorption. For smaller corrections a Si-only solution will do.

As the total compensation may run up to 30%, the maximum total thickness will be around 90 nm for Si and 6 nm for Al. Depending on the steepness of the correction profile, the amount of layers can be determined. A realistic value can be three sub-layers, as each layer pair will smooth out at the edges.

The mirrors 21(i) may be multilayer mirrors as are commonly employed in EUV lithography. In this case, the reflecting surface 39 of the mirrors 21(i) must have good reflecting properties for EUV radiation. Depending on the particular positions of the mirror 21(i) in the projection optics box POB, the effect of the sub-layers 61(j) on the beam of radiation PB will vary. For example, if the layers 61(j) are applied on the pupil mirror 21(2), the sub-layers 61(j) will compensate intensity distribution variations independent of field. When applied on other mirrors 21(i), however, the intensity distribution as well as field distribution will be effected.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

The descriptions above are intended to be illustrative, not limiting. Thus, it will be apparent to one skilled in the art that modifications may be made to the present invention as described.

What is claimed is:

1. An optical system comprising an optical component for correcting apodization in the optical system, the optical component being configured to receive a beam of radiation with an upstream intensity distribution that is upstream from the optical component, which upstream intensity distribution deviates from a more desirable intensity distribution due to the apodization, the optical component comprising a layer configured to absorb portions of the beam of radiation as a function of location such that downstream from the optical component the beam of radiation has the more desirable intensity distribution.

2. An optical system according to claim 1, wherein the optical component is located in a pupil plane of the optical system.

3. An optical system according to claim 1, wherein the optical component is a reflective optical component.

4. An optical system according to claim 3, wherein the reflective optical component is a multilayer mirror.

5. An optical system according to claim 1, wherein the layer comprises at least two sub-layers arranged on top of each other, the sub-layers having holes above one another forming a combined hole with a step-shaped wall.

6. An optical system according to claim 5, wherein the sub-layers have a thickness of less than 100 nm.

7. An optical system according to claim 5, wherein the sub-layers comprise a material having a complex index of refraction with an imaginary part and a real part, the real part having a real part value deviating from 1 and the imaginary part being substantially larger than the real part value.

8. An optical system according to claim 7, wherein the sub-layers are made of at least one of silicon and aluminium.

9. An optical system according to claim 5, comprising at least one additional layer located on the optical component within the combined hole, configured to correct phase effects as caused by the layer to the beam of radiation.

10. An optical system according to claim 1, wherein the beam of radiation comprises EUV radiation in a range between 5 and 20 nm.

11. An optical system according to claim 1, wherein the layer on optical component is configured to correct for aberration effects in the optical system.

12. Optical system according to claim 1, wherein the optical system comprises a projection system with at least one further optical component comprising at least one further layer to correct for field effects.

13. An optical component for an optical system for correcting apodization in the optical system, the optical component being configured to receive a beam of radiation with an upstream intensity distribution that is upstream from the optical component, which upstream intensity distribution deviates from a more desirable intensity distribution due to the apodization, the optical component comprising a layer configured to absorb portions of the beam of radiation as a function of location such that downstream from the optical component the beam of radiation has the more desirable intensity distribution.

14. An optical component for an optical system for correcting apodization in the optical system, the optical component being configured to receive a beam of radiation with an upstream intensity distribution that is upstream from the optical component, which upstream intensity distribution deviates from a more desirable intensity distribution due to the apodization, the optical component comprising a layer configured to absorb portions of the beam of radiation as a function of location such that downstream from the optical component the beam of radiation has the more desirable intensity distribution.

15. A method of correcting apodization in an optical system, comprising:
   determining effects of apodization on an intensity distribution of a beam of radiation in a predetermined plane of the optical system;
   determining a more desirable intensity distribution of the beam of radiation in the predetermined plane to correct for the apodization; and
   absorbing portions of the beam of radiation in the predetermined plane as a function of location such that downstream from the predetermined plane the beam of radiation has the more desirable intensity distribution.

16. A method according to claim 15, wherein the predetermined plane is a pupil plane.

17. A device manufacturing method comprising:
   providing a beam of radiation;
   imparting the beam of radiation with a pattern in its cross section;

projecting the beam of radiation after it has been patterned onto a target portion of a substrate;

determining an intensity distribution of the beam of radiation in a predetermined plane of the optical system;

determining a more desirable intensity distribution of the beam of radiation in the predetermined plane; and absorbing portions of the beam of radiation in the predetermined plane as a function of location such that downstream from the predetermined plane the beam of radiation has the more desirable intensity distribution.

18. A device manufactured by the method of claim 17.

* * * * *